US012513861B2

(12) United States Patent
Collier

(10) Patent No.: US 12,513,861 B2
(45) Date of Patent: Dec. 30, 2025

(54) SERVER HOLDER WITH FLOW RESTRAINING DEVICE

(71) Applicant: INTERSTITIAL SYSTEMS, INC., Esterel (CA)

(72) Inventor: William Randolf Collier, Esterel (CA)

(73) Assignee: INTERSTITIAL SYSTEMS, INC., Esterel (CA)

( * ) Notice: Subject to any disclaimer, the term of this patent is extended or adjusted under 35 U.S.C. 154(b) by 203 days.

(21) Appl. No.: 18/048,221

(22) Filed: Oct. 20, 2022

(65) Prior Publication Data

US 2023/0141044 A1 May 11, 2023

Related U.S. Application Data

(60) Provisional application No. 63/257,667, filed on Oct. 20, 2021.

(51) Int. Cl.
*H05K 7/20* (2006.01)
*H05K 5/02* (2006.01)

(52) U.S. Cl.
CPC ....... *H05K 7/20745* (2013.01); *H05K 5/0204* (2013.01); *H05K 7/20145* (2013.01); *H05K 7/20181* (2013.01)

(58) Field of Classification Search
CPC ........... H05K 7/20145; H05K 7/20181; H05K 7/20745; H05K 5/0204
See application file for complete search history.

(56) References Cited

U.S. PATENT DOCUMENTS

| | | | |
|---|---|---|---|
| 3,420,018 | A | 1/1969 | Fork |
| 3,516,347 | A | 6/1970 | May |
| 3,592,956 | A | 7/1971 | Fork |
| RE28,035 | E | 6/1974 | Fork |
| 4,417,191 | A | 11/1983 | Schmidt |
| 4,852,315 | A | 8/1989 | Fukayama |
| 4,874,127 | A | 10/1989 | Collier |
| 4,887,663 | A | 12/1989 | Auxier |
| 5,144,793 | A | 9/1992 | Able |
| 5,468,184 | A | 11/1995 | Collier |
| 5,477,649 | A | 12/1995 | Bessert |
| 5,483,776 | A | 1/1996 | Poppe |
| 5,546,717 | A | 8/1996 | Penczak |

(Continued)

FOREIGN PATENT DOCUMENTS

| | | | | |
|---|---|---|---|---|
| CN | 109379878 A * | 2/2019 | | ......... H05K 7/20736 |
| KR | 100712720 B2 | 4/2007 | | |

OTHER PUBLICATIONS

English Translation of CN 109379878 A (Year: 2019).*

*Primary Examiner* — Mukundbhai G Patel
(74) *Attorney, Agent, or Firm* — Norton Rose Fulbright Canada LLP

(57) ABSTRACT

A server holder includes a holder defining a holder volume and having server supports spaced apart in the holder volume to support servers. The holder defines a holder opening to permit fluid communication between the server supports in the holder volume and air flowing outside the holder. At least one baffle is mounted to the holder adjacent to one or more of the server supports. The at least one baffle extends outwardly from the holder. The at least one baffle is shaped and sized to locally restrain the air flowing outside the holder around the one or more server supports.

20 Claims, 9 Drawing Sheets

(56) References Cited

U.S. PATENT DOCUMENTS

| | | | | |
|---|---|---|---|---|
| 5,901,515 | A | 5/1999 | Chen | |
| 6,604,993 | B1 | 8/2003 | Boniface | |
| 8,295,035 | B2 | 10/2012 | Collier | |
| 9,918,411 | B2 * | 3/2018 | Rinke | H05K 7/20727 |
| 2003/0097806 | A1 | 5/2003 | Brown | |
| 2004/0218355 | A1 * | 11/2004 | Bash | G06F 1/206<br>454/184 |
| 2013/0128450 | A1 * | 5/2013 | Redshaw | G06F 1/20<br>73/861.47 |

* cited by examiner

SERVER HOLDER WITH FLOW RESTRAINING DEVICE

TECHNICAL FIELD

The application relates generally to air distribution and, more particularly, to air distribution in large conditioned air plenum environments such as data centers.

BACKGROUND

In data centers, it is generally desirable to maximize the number of servers per unit area of floor space. It is also necessary to cool the servers to prevent them from overheating.

SUMMARY

In one aspect, there is provided a data center, comprising: a room; at least one fan operable to convey air through the room; server holders in the room, at least one of the server holders including: a holder defining a holder volume and having server supports spaced apart in the holder volume, the holder defining a holder opening to permit fluid communication between the holder volume and the air in the room; a plurality of servers supported by the server supports to be in fluid communication with the air in the room via the holder opening; and at least one baffle mounted to the holder adjacent to one or more servers of the plurality of servers, the at least one baffle extending outwardly from the holder into a volume of the room, the at least one baffle shaped and sized to locally restrain the air being conveyed through the volume of the room around the one or more servers.

In an embodiment according to any of the previous embodiments, the at least one baffle extends outwardly from the holder at an angle defined with respect to the holder, the angle being greater than 0 degrees and less than 90 degrees.

In an embodiment according to any of the previous embodiments, the angle is greater than 45 degrees and less than 90 degrees.

In an embodiment according to any of the previous embodiments, the angle is 60 degrees.

In an embodiment according to any of the previous embodiments, the at least one baffle has a length defined between a root of the at least one baffle adjacent to the holder and a tip of the at least one baffle, the length being less than 10 inches.

In an embodiment according to any of the previous embodiments, the length is less than 5 inches.

In an embodiment according to any of the previous embodiments, the length is between 2.5 inches and 3.5 inches.

In an embodiment according to any of the previous embodiments, the at least one baffle has a horizontal orientation.

In an embodiment according to any of the previous embodiments, the at least one baffle has a vertical orientation.

In an embodiment according to any of the previous embodiments, wherein the at least one baffle includes a plurality of baffles.

In an embodiment according to any of the previous embodiments, the at least one baffle has a horizontal orientation, and the at least one baffle is adjacent to a number of servers less than all of the servers.

In an embodiment according to any of the previous embodiments, the at least one baffle has a vertical orientation, and the at least one baffle is adjacent to all of the servers.

In an embodiment according to any of the previous embodiments, the room includes a floor defining an underfloor and includes at least one floor panel positioned on the floor in front of the holder of the at least one of the server holders, the at least one fan operable to convey the air through the underfloor and into the room via the at least one floor panel: the holder being upright and the servers supported by the server supports being vertically spaced apart, the servers including one or more lower servers positioned closer to the at least one floor panel than a remainder of the servers; and the at least one baffle having a horizontal orientation and mounted to the holder adjacent to one or more of the one or more lower servers.

In an embodiment according to any of the previous embodiments, the at least one baffle includes a plurality of baffles, the plurality of baffles including a first baffle mounted to the holder in front of a first server of the one or more of lower servers, and a second baffle mounted to the holder in front of a second server of the one or more of lower servers, the first baffle being above the second baffle.

In an embodiment according to any of the previous embodiments, the at least one fan is operable to convey the air through the room from a wall of the room, the server holders arranged in a row of server holders, one or more leading server holders of the row of server holders positioned closer to the wall than a remainder of the server holders of the row of server holders, one or more of the one or more leading server holders including: the holder being upright and the servers supported by the server supports being vertically spaced apart; and the at least one baffle having a vertical orientation and extending across a majority of the vertically-spaced apart server supports.

In an embodiment according to any of the previous embodiments, the at least one baffle includes two or more baffles horizontally spaced apart from each other.

In another aspect, there is provided a server holder, comprising: a holder defining a holder volume and having server supports spaced apart in the holder volume to support servers, the holder defining a holder opening to permit fluid communication between the server supports in the holder volume and air flowing outside the holder; and at least one baffle mounted to the holder adjacent to one or more of the server supports, the at least one baffle extending outwardly from the holder, the at least one baffle shaped and sized to locally restrain the air flowing outside the holder around the one or more server supports.

In an embodiment according to any of the previous embodiments, the at least one baffle extends outwardly from the holder at an angle defined with respect to the holder, the angle being greater than 1 degree and less than 90 degrees.

In an embodiment according to any of the previous embodiments, the angle is greater than 45 degrees and less than 90 degrees.

In an embodiment according to any of the previous embodiments, the angle is 60 degrees.

In an embodiment according to any of the previous embodiments, the at least one baffle has a length defined between a root of the at least one baffle adjacent to the holder and a tip of the at least one baffle, the length being less than 10 inches.

In an embodiment according to any of the previous embodiments, the length is less than 5 inches.

In an embodiment according to any of the previous embodiments, the length is between 2.5 inches and 3.5 inches.

In an embodiment according to any of the previous embodiments, the at least one baffle has a horizontal orientation.

In an embodiment according to any of the previous embodiments, the at least one baffle has a vertical orientation.

In an embodiment according to any of the previous embodiments, the at least one baffle includes a plurality of baffles.

In an embodiment according to any of the previous embodiments, the holder is upright and the server supports are vertically spaced apart, the server supports including one or more lower server supports positioned closer to a bottom of the holder than a remainder of the server supports, the at least one baffle having a horizontal orientation and mounted to the holder adjacent to one or more of the one or more lower server supports.

In an embodiment according to any of the previous embodiments, the at least one baffle includes a plurality of baffles, the plurality of baffles including a first baffle mounted to the holder in front of a first server support of the one or more of lower server supports, and a second baffle mounted to the holder in front of a second server support of the one or more of lower server supports, the first baffle being above the second baffle.

In an embodiment according to any of the previous embodiments, the holder is upright and the server supports are vertically spaced apart, the at least one baffle having a vertical orientation and extending across a majority of the vertically-spaced apart server supports.

In an embodiment according to any of the previous embodiments, the at least one baffle includes two or more baffles horizontally spaced apart from each other.

In an embodiment according to any of the previous embodiments, the server holder is one of a server cabinet and a server rack.

In a further aspect, there is provided a server cabinet/rack baffle mountable to a server cabinet/rack to face one or more of server supports of the server cabinet/rack, and to extend outwardly from the server cabinet/rack, the baffle shaped and sized to locally restrain the air flowing outside the server cabinet/rack around the one or more server supports.

In an embodiment according to any of the previous embodiments, the baffle is mountable to extend outwardly from the server cabinet/rack at an angle defined with respect to the server cabinet/rack, the angle being greater than 1 degree and less than 90 degrees.

In an embodiment according to any of the previous embodiments, the angle is greater than 45 degrees and less than 90 degrees.

In an embodiment according to any of the previous embodiments, the angle is 60 degrees.

In an embodiment according to any of the previous embodiments, the baffle has a length defined between a root of the baffle and a tip of the baffle, the length being less than 10 inches.

In an embodiment according to any of the previous embodiments, the length is less than 5 inches.

In an embodiment according to any of the previous embodiments, the length is between 2.5 inches and 3.5 inches.

In an embodiment according to any of the previous embodiments, the baffle is mountable to have a horizontal orientation.

In an embodiment according to any of the previous embodiments, the baffle is mountable to have a vertical orientation.

In a further aspect, there is provided a method of restraining a flow of air around part of a server cabinet/rack, the method comprising: mounting at least one baffle to an exterior of the server cabinet/rack adjacent to one or more server supports of the server cabinet/rack, such that the at least one baffle extends outwardly from the server cabinet/rack to restrain the flow of air outside the server cabinet/rack around the one or more server supports.

In an embodiment according to any of the previous embodiments, mounting the at least one baffle includes mounting the at least one baffle at an angle defined with respect to the exterior of the server cabinet/rack, the angle being greater than 0 degrees and less than 90 degrees.

In an embodiment according to any of the previous embodiments, mounting the at least one baffle includes mounting the at least one baffle to have a horizontal orientation.

In an embodiment according to any of the previous embodiments, mounting the at least one baffle includes mounting the at least one baffle to have a vertical orientation.

In an embodiment according to any of the previous embodiments, mounting the at least one baffle includes mounting a plurality of baffles.

In an embodiment according to any of the previous embodiments, mounting the at least one baffle includes mounting the at least one baffle to have a horizontal orientation, and mounting the at least one baffle adjacent to a number of server supports less than all of the server supports.

In an embodiment according to any of the previous embodiments, mounting the at least one baffle includes mounting the at least one baffle to have a vertical orientation, and mounting the at least one baffle adjacent to all of the server supports.

In a further aspect, there is provided a method of increasing a capacity of a server cabinet/rack, the method comprising: mounting at least one baffle to an exterior of the server cabinet/rack adjacent to one or more server supports of the server cabinet/rack, such that the at least one baffle extends outwardly from the server cabinet/rack to restrain the flow of air outside the server cabinet/rack around the one or more server supports.

In an embodiment according to any of the previous embodiments, the method further includes adjusting an ability of the at least one baffle to restrain the flow of air by adjusting an angle defined between the at least one baffle and the exterior of the server cabinet/rack, the angle being greater than 0 degrees and less than 90 degrees.

DESCRIPTION OF THE DRAWINGS

Reference is now made to the accompanying figures in which.

DETAILED DESCRIPTION

Figure 1A:
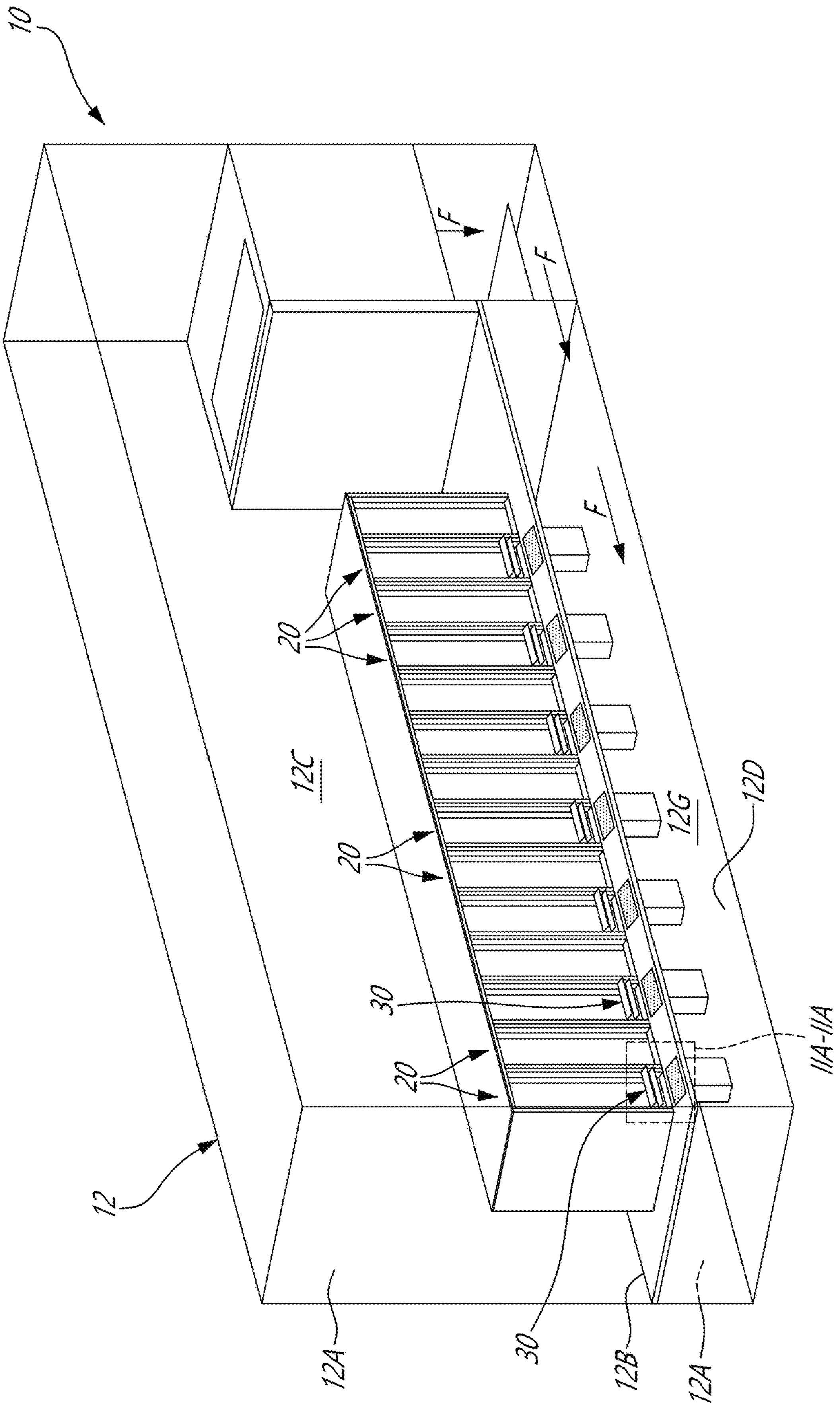
FIG. 1A is a perspective view of a room of a data center.
Figure 1B:
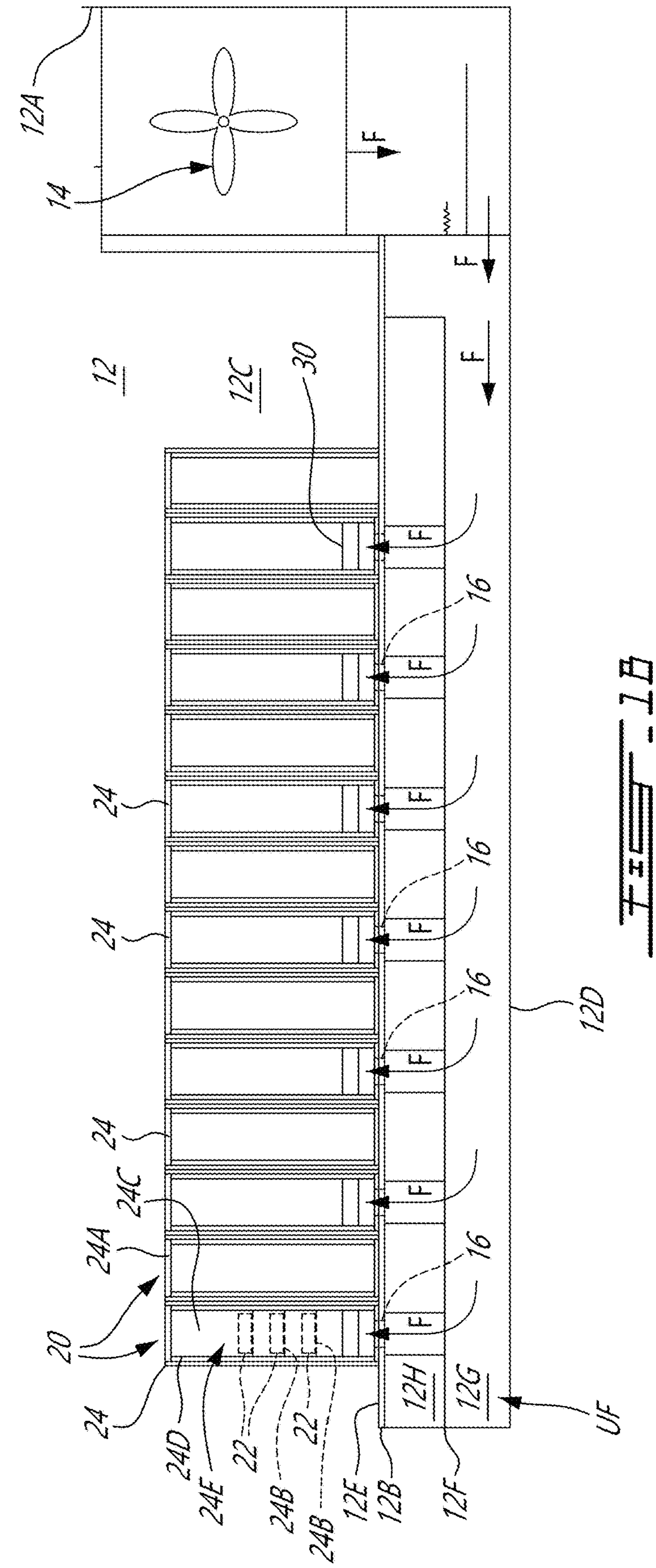
FIG. 1B is a front view of the room of FIG. 1A.

FIGS. 1A and 1B show a room 12 of a data center 10. The room 12 may be part of a building of the data center 10, and may be of any suitable size or shape. The room 12 has one or more walls 12A and a floor 12B which define and delimit some or all of an inner volume 12C of the room 12. The building of the data center 10 may have one large room 12 that occupies all of the interior of the building, multiple rooms 12, or any combination of these. For the purposes of explanation and clarity, FIGS. 1A and 1B only show a part of the room 12 of the data center 10. More particularly, FIGS. 1A and 1B show the part of the room 12 that is occupied by a single row of server holders 20 housed within the building and forming part of the data center 10. The server holders 20 are located in the inner volume 12C of the room 12 and are capable of supporting one or more servers 22. It is understood that the room 12 of the data center 10 may include multiple rows of server holders 20 similar to, or different from, the row of server holders 20 shown in FIGS. 1A and 1B. Parts of the present disclosure relate to data centers 10, and it is appreciated that the present disclosure is applicable to other centers and systems, whether they are electrical or electric-mechanical.

Referring to FIGS. 1A and 1B, each server holder 20 (also referred to as server cabinet/rack) includes a holder 24. The holder 24 is a structure for supporting the servers 22, and can take any suitable form. For example, and referring to FIGS. 1A and 1B, the holder 24 is a cabinet 24A (i.e. a "server cabinet"). The holder 24 has multiple walls which are interconnected to define an inner holder volume 24C. The holder 24 has multiple server supports 24B, each of which supports one or more servers 22 thereon. The server supports 24B are spaced apart from each other within the holder volume 24C. The server supports 24B may take any suitable form or shape to achieve their purpose. For example, in a configuration, the server supports 24B are rails attached to the walls of the holder 24 which allow for the servers 22 to be slid along the rails to be installed in the server holder 20. For example, in another configuration, the server supports 24B are shelves which support the servers 22 and on which the servers 22 rest. For example, in another configuration, the server supports 24B are racks. Other configurations for the server supports 24B are possible. Referring to FIGS. 1A and 1B, the holder 24 has an upright orientation, and the server supports 24B are oriented horizontally and are vertically spaced apart from each other by equal distances. In an alternate embodiment, the server supports 24B are oriented vertically, and thus may take the form of holder dividers that are horizontally spaced-apart from each other. The server supports 24B may also have any other suitable orientation and inter-support spacing. The holder volume 24C is separate from the inner volume 12C of the room 12, and is able to fluidly communicate with the inner volume 12C so that the air of the inner volume 12C penetrates into the holder volume 24C to cool the servers 22 supported by the server supports 24B. This fluid communication between the inside and outside of the holder 24 may take different forms. For example, and referring to FIGS. 1A and 1B, the holder 24 includes a door 24D having a door frame pivotably mounted to a wall of the holder 24. The door 24D includes or defines a holder opening 24E through which cooling air enters the holder volume 24C from the inner volume 12C of the room 12. The holder opening 24E may be uncovered, or may include an air-permeable mesh, screen, or grate to prevent the ingress of physical objects into the holder volume 24C. The holder opening 24E thus permits fluid communication between the holder volume 24C and the air in the room 12 in order to cool the servers 22 in the holder 24. The holder opening 24E is located along a portion of the holder 24 that is designated herein as the "front" of the holder 24. The holder 24 may take other forms. For example, in an alternate embodiment, the holder 24 is a rack support (i.e. a "server rack"), in which the server supports 24B are racks, and which may be free of a door. Additional forms for the holder 24 are also possible.

Referring to FIGS. 1A and 1B, each of the servers 22 is resting on one of the server supports 24B which are shelves, and is positioned between two vertically-adjacent shelves 24B. The servers 22 may be positioned on the shelves 24B such that they are recessed from the front of the holder 24. For example, the servers 22 may be recessed about four inches from the surface of the door 24D, or up to six inches. In the embodiment where the holder 24 has no door 24D, or is a server rack, the servers 22 may not be recessed and may be positioned right up to the edge of the holder 24.

Referring to FIGS. 1A and 1B, the data center 10 has one or more fans 14. The one or more fans 14 function to convey a flow of air F through the room 12 in order to cool the servers 22 which are supported on/by the server holders 20. The fans 14 and their associated components and machinery thus form one or more cooling units of the data center 10, and are part of an air distribution system of the data center 10 which may include vents, ducting, valves, and any other component of an air distribution system. The capacity of the fans 14 is selected based on the anticipated cooling requirements of the servers 22, and there may be one or more fans 14 in each room 12, or one or more fans 14 used to cool multiple rooms 12 housing servers 22. Referring to FIGS. 1A and 1B, the fan 14 is located within the room 12, and within the inner volume 12C of the room 12, in order to convey the flow of air F through the inner volume 12C. In an alternate embodiment, one or more fans 14 are positioned outside the room 12 and operate to convey the cooling flow of air F from outside the inner volume 12C to the inner volume 12C of the room 12. Referring to FIGS. 1A and 1B, the flow of air F conveyed by the fan 14 is drawn from outside the room 12, such as from the environment outside of the building of the data center 10. In an alternate embodiment, the flow of air F is internal air from the inner volume 12C that is cooled in a suitable heat exchanger before being conveyed by the fan 14. In addition to conveying the flow of air F, the fan 14 may circulate the flow of air F through the inner volume 12C, such that air from the inner volume 12C is drawn into the fan 14 and subsequently pressurized by the fan 14 to be conveyed back to the inner volume 12C. The flow of air F circulated by the fan 14 may be cooled by any suitable heat exchange medium, such as glycol, water or salt water, prior to being conveyed by the fan 14.

Referring to FIGS. 1A and 1B, the room 12 has an underfloor UF through which the flow of air F can travel so as to allow for underfloor cooling of the inner volume 12C. The floor 12B defines the underfloor UF, and the floor 12B is installed on a slab 12D of the building of the data center 10. Below a walking surface 12E of the floor 12B and vertically spaced apart from it is a conductor support floor 12F. The conductor support floor 12F is substantially co-extensive in area with the walking surface 12E. The volume between the underside of the walking surface 12E and the upper surface of the conductor support floor 12F includes a wire way level 12H. Electrical conductors and other electrical or mechanical components may be housed in the wire way level 12H and lying on the conductor support floor 12F. Beneath the conductor support floor 12F is and isolated conditioned air plenum 12G. The air plenum 12G is substantially co-extensive in area with walking surface 12E and the conductor support floor 12F. The air plenum 12G and/or conductor support floor 12F may have portions at different vertical positions or levels, and reference is made in this regard to U.S. Pat. No. 10,927,555 B2, the entire contents of which are incorporated by reference herein.

Referring to FIGS. 1A and 1B, the room 12 is cooled via an "underfloor cooling" system. The cooling flow of air F is conveyed by the fan 14 into the air plenum 12G of the underfloor UF. From the plenum 12G, the cooling flow of air F enters the inner volume 12C of the room via one or more floor panels 16. Each floor panel 16 covers an opening in the floor 12B, and is a perforated and air-permeable grate or mesh, thereby forming a floor vent through which the flow of air F is introduced into the inner volume 12C. Referring to FIGS. 1A and 1B, the floor panels 16 are positioned on the floor 12B in front of every second holder 24 of the row of server holders 20. In an alternate embodiment, the floor panels 16 are positioned in front of every holder 24, or in front of every third, fourth, fifth, etc. holder 24. For example, for lower-capacity server holders 20 (e.g. those in which the collective wattage of the servers 22 is 9 kW), the cooling requirements of the servers 22 may only require that the floor panels 16 be positioned at every second holder 24. For higher-capacity server holders 20 (e.g. those in which the collective wattage of the servers 22 is 18 kW or 30 kW and which may have higher heat loads), the cooling requirements may require that a floor panel 16 be positioned in front of every server holder 20 in order to adequately cool its servers 22. The floor panels 16 may be positioned away from the server holders 20 as well, such as adjacent to the walls 12A of the room 12, in order to improve the flow of air F through the inner volume 12C or to ensure adequate cooling of the servers 22 in the server holder 22 at the end of the row. The inner volume 12C of the room 12 is separated from the volume of the air plenum 12G of the underfloor UF, and the inner volume 12C is in fluid communication with the air plenum 12G only via the floor panels 16.

FIGS. 1A and 1B show a configuration of the room 12 that has "underfloor cooling" over two floor levels (i.e. the floor 12B and the conductor support floor 12F). Other designs for the room 12 and for the fan 14 are possible. For example, in another possible configuration of the room 12 with "underfloor cooling", there may be a single floor level which is the floor 12B. The floor 12B in such a configuration is spaced apart from the slab 12D to define the air plenum 12G, and the electrical conductors and other electrical or mechanical components are located in the air plenum 12G along the slab 12D or in cable trays. Other designs for the room 12 and for the fan 14 are possible, such as a "flooded room" design described in greater detail below, or a combination of underfloor cooling and flooded room designs.

Figure 4:
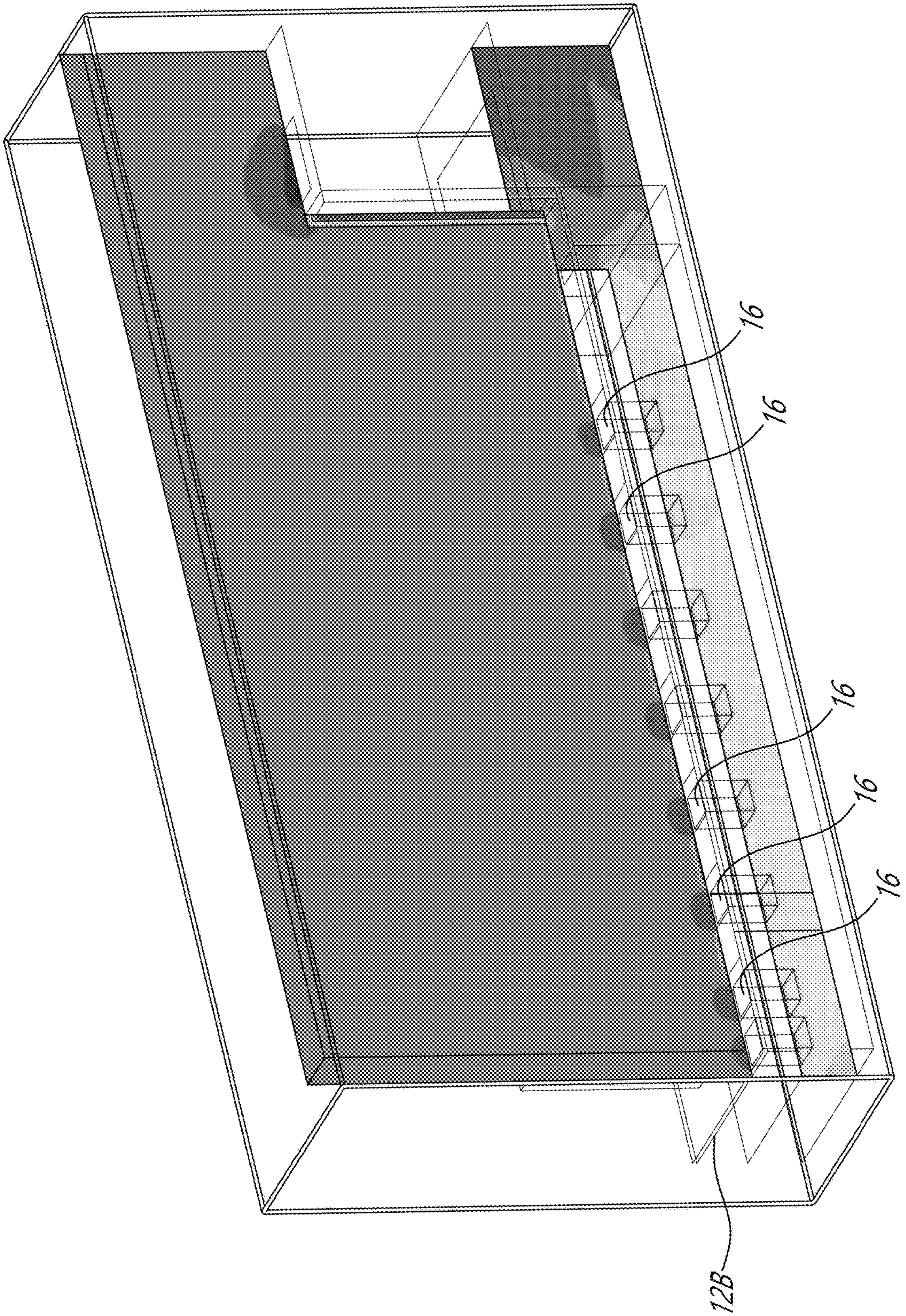
FIG. 4 is a pressure map showing pressure profiles for a part of a room of a data center.

The inventor has observed that the relatively high-velocity cooling flow of air F emanating from the floor panels 16 creates a Venturi effect above the floor panels 16 near the bottom of the server holders 22. One or more of the servers 22 located along the lower reaches of the server cabinet 20 adjacent the floor panels 16 may thus experience lower inlet pressure. This is more clearly shown in FIG. 4, which shows a pressure map for the server holders 20 of FIGS. 1A and 1B. The pressure map shows that the inlet pressure for all the server holders 20 shown in FIG. 4 is lowest in the region immediately above the floor panels 16, and thus in the same region where some of the servers 22 are positioned closest to the floor panels 16. The lower inlet pressure in the region of these servers 22 causes the fans of these servers 22 to work harder (and thus consume more energy) against a higher pressure drop, and deliver less cooling flow to the hot internal components of the servers 22. This means that these servers 22 located near the bottom of the sever holder 20 and adjacent the floor panels 16 may be getting less air than the other servers 22 (a phenomenon caused by the Venturi effect, which is sometimes referred to in industry as "blow-by air"), resulting in higher equipment operating temperatures and/or higher power consumption. The higher power consumption of these servers 22 is expensive energy that increases the operating costs of the data center 10.

In order to address the higher power consumption of these servers 22, one or more of the server holders 20 and one or more of the rows of server holders 20 may include a flow-restraining or flow-guiding device.

Referring to FIGS. 2A to 2D, one or more of the server holders 20 includes one or more baffles 30. The baffles 30 are physical objects which have a physical extent, and engage with the flow of air F so that more of the air is received by the servers 22 to cool the servers 22. The baffles 30 may thus be any device or object that functions to restrain the flow of the air F locally around the servers 22 in order to increase the pressure of the air, such as by interfering with the flow of air F. The baffles 30 may therefore be any suitable guide vane, blade, fluid damper, louver, flow restrictor, turning vane, or other such flow-restraining device which achieves the above-described function.

Referring to FIGS. 2A to 2D, the baffles 30 are mounted to the holder 24 adjacent to one or more of the servers 22. In the depicted embodiment, the baffles 30 are mounted to the holder 24 adjacent to the servers 22 that are closest to the floor panels 16. Referring to FIGS. 2A to 2D, each baffle 30 is mounted adjacent to one of the servers 22. The baffles 30 are mounted to the holder 24 to face the servers 22 and the server supports 24B they are supported by. The baffles 30 extend outwardly from the holder 24 into the inner volume 12C of the room 12, so as to engage the cooling flow of air F of the room 12 flowing past the holder 24. The baffles 30 may be attached to the door 24D or another part of the holder 24 using any suitable mechanical fastener or adhesive, so as to extend into the room 12. In the embodiment where the holder 24 has a door 24D and the baffles 30 are mounted thereto, the baffles 30 displace with the door 24D. In an alternate embodiment, one or more of the baffles 30 extends inwardly into the holder 24 and into the holder volume 24C, such that the baffles 30 are present on the inside of the holder 24. By "mounted", it is understood that the baffles 30 may be added or attached to an existing holder 24, for instance as a retrofit. Additionally or alternatively, "mounted" baffles 30 (or the step of mounting the baffles 30) may include incorporating (for instance as add-on components or integral members of the holder 24) the baffles 30 during the manufacturing of a holder 24. Other arrangements for the mounting of the baffles 30 may be contemplated.

The one or more baffles 30 are shaped and sized to locally restrain the flow of air F that is being conveyed through the inner volume 12C of the room 12 in the vicinity of the servers 22 adjacent to which the baffles 30 are mounted. The baffles 30 function to interfere with the flow of air F in the immediate vicinity of the baffles 30 and adjacent to the servers 22 that the baffles 30 are intended to assist, so that the baffles 30 can slow the flow of air F and/or increase the static pressure of the air and/or guide the flow of air F in the vicinity of the servers 22 served by the baffles 30. By locally restraining the flow of air F around the servers 22 in this manner, the baffles 30 allow the fans of the servers 22 to more efficiently draw cooling air into the servers 22 to cool their internal components. In this way, the baffles 30 contribute to countering or reducing the Venturi effect described above which causes the fans of these servers 22 to work harder (and thus consume more energy) against a higher pressure drop, and deliver less cooling flow to the hot internal components of the servers 22. With the baffles 30, the fans of these servers 22 may therefore be able to consume less energy to adequately cool their components compared to a configuration where the baffles 30 are not present, thereby contributing to lowering the total energy consumption of the data center 10. For example, in the configuration of the room 12 shown in FIGS. 2A and 2B with underfloor cooling, the baffles 30 function to interfere with the flow of air F coming from the floor panels 16 that is in the immediate vicinity of the baffles 30. The baffles 30 disrupt the flow of air F adjacent to the servers 22 that the baffles 30 are intended to assist, thereby slowing the flow of air F and/or increasing the static pressure of the air in the vicinity of the servers 22 served by the baffles 30.

The baffles 30 disclosed herein thus help to reduce the consequences of the Venturi effect described above. While the beneficial effect of the baffles 30 on the power consumption of individual servers 22 may be small, some data centers 10 contain thousands or tens-of-thousands of servers 22 experiencing the Venturi effect, such that the cumulative beneficial effect of the baffles 30 over all these servers 22 over long durations of time may provide an important contribution to reducing the overall energy consumption of the data center 10 over that period of time.

The baffles 30 contribute to enhancing the air distribution and air delivery effectiveness, aka, "ventilation effectiveness," of large conditioned air plenum environments for installation in building structures including, but not limited to, data centers and similar rooms that have high heat loads requiring dedicated cooling systems. By enhancing the ventilation effectiveness in the data center 10, it may be possible to increase the number of server holders 20, and thereby increase the number of servers 22, in the data center 10, all while occupying the same white space in the data center 10. This may allow for reducing both the capital expenditure for constructing a data center 10, as well as the operating expenditures associated with running a data center 10.

By enhancing the ventilation effectiveness in the data center 10, it may be possible to increase the capacity of the server holders 20 of the data center 10. Some server holders 20 are rated by their power consumption (e.g. 9 kW, 18 kW, 30 kW, etc.), and air ventilation systems for data centers 10 are often designed based on the expected power consumption of the server holders 20. By helping to improve the cooling of some of the servers 22 in the data center 10, the baffles 30 may allow for higher capacity server holders 20 (e.g. 18 kW instead of 9 kW, or 30 kW instead of 18 kW) with higher heat loads to be used in the data center 10. The ability of the baffles 30 to locally restrain the flow of air F may be adjusted by "opening" or "closing" them, as described below. The capacity of the server holders 20, assessed in kW of power consumption, may thus be adjusted (increased or decreased) by simply adjusting the baffle 30 open or closed.

The baffles 30 may have various orientations and be arranged in different numbers, in order to achieve the functionalities ascribed to the baffles 30 herein.

For example, and referring to FIGS. 2A to 2D, the baffles 30 extend horizontally across the holder opening 24E in a direction that is substantially parallel to the floor 12B. The baffles 30 have a width defined along their horizontal extent. Each of the baffles 30 is a continuous or uninterrupted body. Referring to FIGS. 2A to 2D, the baffles 30 extend across the holder opening 24E of only one of the holders 24. In an alternate embodiment, the baffles 30 extend across the holder openings 24E of multiple holders 24. In an embodiment, the baffles 30 extend across only some of the holder opening 24E that is in fluid communication with the holder volume 24C. The baffles 30 may extend at any angle defined relative to the floor 12B that is greater than 0 degrees and less than 90 degrees. The baffles 30 have a horizontal orientation in that they are oriented parallel to the floor 12B. Referring to FIGS. 2A to 2D, the number of baffles 30 mounted to the holder 24 is less than the number of servers 22 in the holder 24. Referring to FIGS. 2A to 2D, the number of baffles 30 corresponds to the number of servers 22 they are intended to assist. Referring to FIGS. 2A to 2D, the number of baffles 30 is two, and they are mounted to the holder 24 adjacent to two of the servers 22. Referring to FIGS. 2A to 2D, the baffles 30 are positioned adjacent to a number of servers 22 in the holder 24 that is less than all of the servers 22 in the holder 24.

Figure 2B:
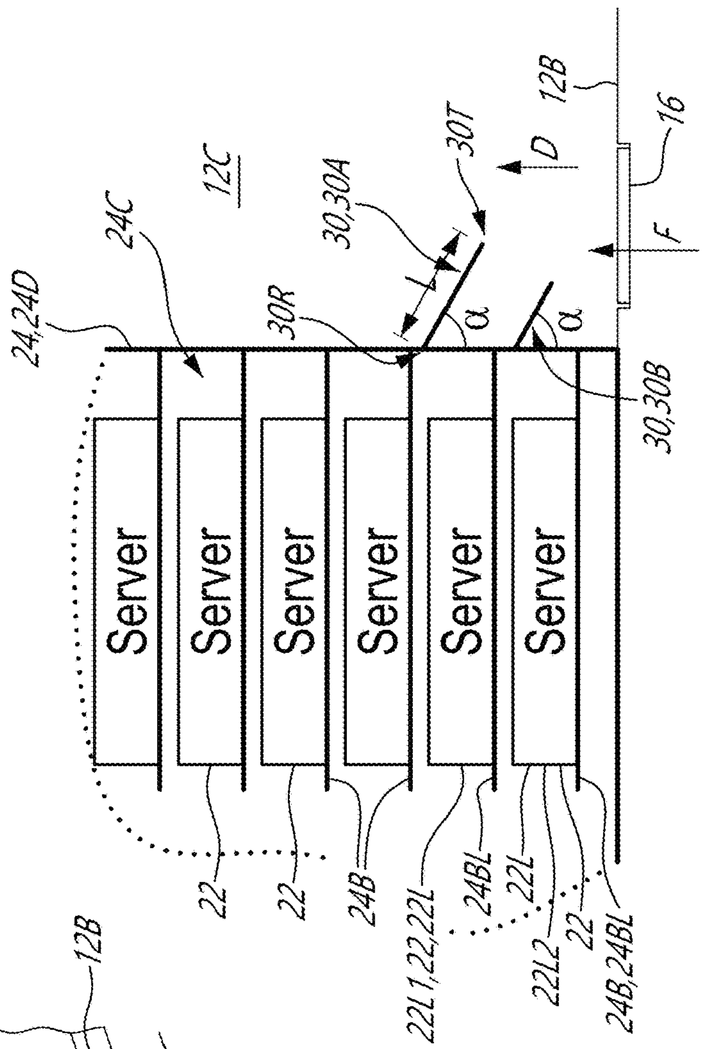
FIG. 2B is an enlarged side section view of the portion IIA-IIA in FIG. 1A.
Figure 2A:
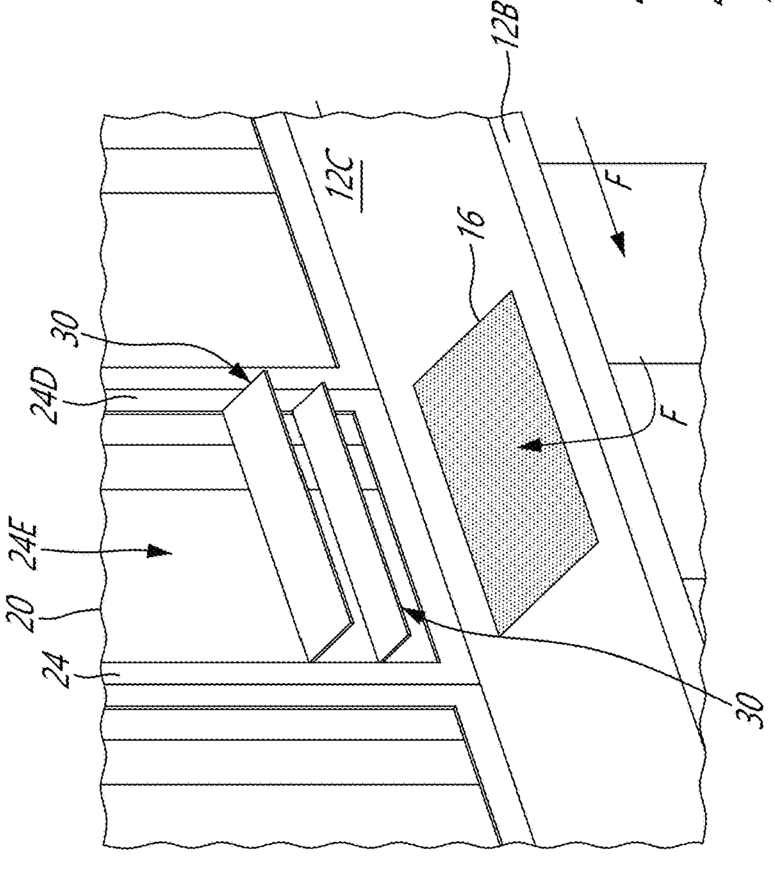
FIG. 2A is an enlarged perspective view of the portion IIA-IIA in FIG. 1A.
Figure 2C:
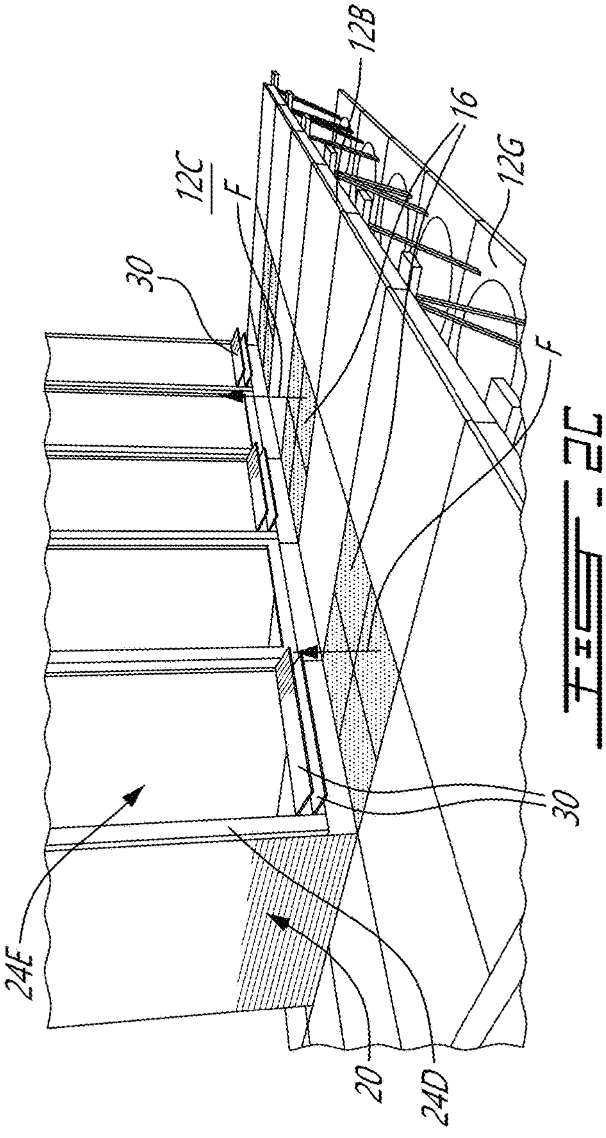
FIG. 2C is an enlarged perspective view of part of FIG. 1A.
Figure 2D:
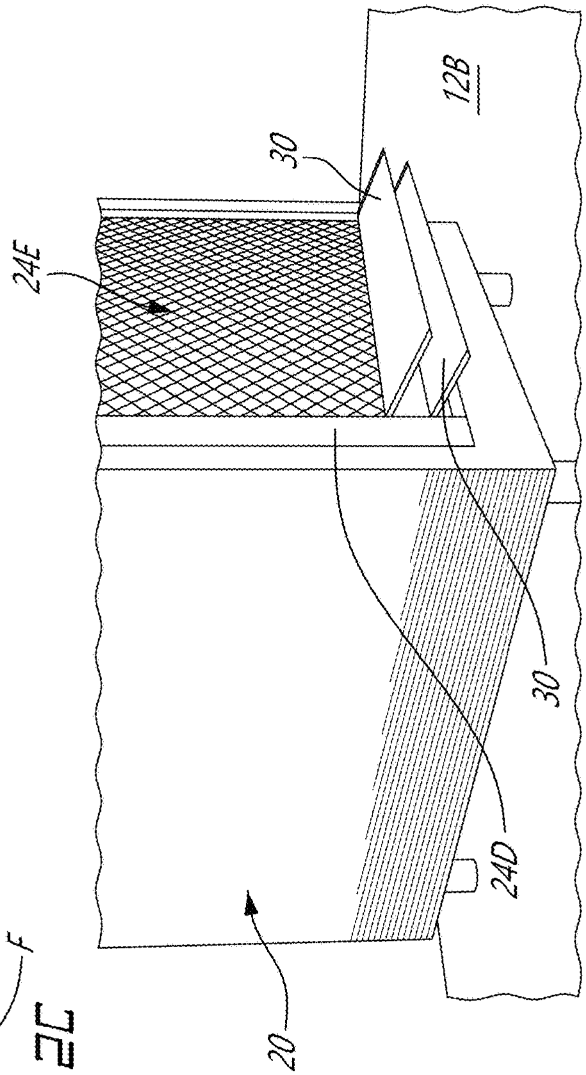
FIG. 2D is an enlarged perspective view of part of FIG. 2C.

In the configuration of the room 12 that has underfloor cooling shown in FIGS. 2A and 2B, the holders 24 have upright orientations, and the servers 22 are on vertically-spaced apart server supports 24B to form a vertical stack of servers 22. The servers 22 including one or more lower servers 22L. The lower servers 22L are the first servers 22 in the holder 24 when counting from the floor 12B in an upward direction. The lower servers 22L are the servers 22 in the lower server holder 20 that are closest to the floor 12B, and thus closest to the floor panel 16. Referring to FIG. 2B, there are two lower servers 22L and a "dual baffle" configuration. A first baffle 30A is mounted to the holder 20 in front of a first lower server 22L1, and a second baffle 30B is mounted to the holder 24 in front of a second server 22L2 of the lower servers 22L. The first baffle 30A is located vertically above the second baffle 30B. The lower servers 22L are mounted on lower racks or server supports 24BL, which are positioned with respect to the other server supports 24B similarly to the lower servers 22L.

Referring to FIG. 2B, the lower servers 22L are the lowermost servers 22L of all the servers 22 in the same holder 24. In other configurations, there may be only one lower server 22L, or between two and five lower servers 22L, depending on the Venturi effect caused by the flow of air F from the nearest floor panel 16. The number of lower servers 22L in a holder 24 is less than the total number of servers 22 in the same holder 24. The number of lower servers 22L in a holder 24 is less than half of the total number of servers 22 in the same holder 24. In this configuration of the server holders 20, and referring to FIG. 2B, the horizontal baffles 30 extending outwardly from the holders 24 and over the floor panels 16 function to interfere with the flow of air F from the floor panels 16 in the immediate vicinity the lower servers 22L, so that the baffles 30 can slow the flow of air F and/or increase the static pressure of the air and/or guide the flow of air F in the vicinity of the lower servers 22L. The baffles 30 in FIGS. 2A and 2B thus contribute to countering or reducing the impact of the Venturi effect described above on the lower servers 22L, which are the servers 22 in the holder 24 which may be most negatively impacted by the Venturi effect.

The baffles 30 may have various shapes and sizes, in addition to their various possible orientations and arrangements in different numbers, in order to achieve the functionalities ascribed to the baffles 30 herein.

For example, and referring to FIG. 2B, the baffles 30 extend outwardly from the holder 24 at an angle α that is defined with respect to part of the holder 24, for example the door 24D of the holder 24. The angle α may also be defined with respect to the direction D of the flow of air F from the floor panels 16, where the direction D is substantially perpendicular to the floor 12B. The baffles 30 are inclined toward the floor panel 16, and thus into the direction of the flow of air F, such that the angle α is greater than 0 degrees and less than 90 degrees. In an embodiment, the angle α is greater than 45 degrees and less than 90 degrees. In an embodiment, the angle α is about 60 degrees. In an embodiment, the angle α is greater than 0 degrees and less than 45 degrees. The angle α may be adjusted to "open" or "close" each baffle 30 with respect to the oncoming flow of air F. "Opening" the baffle 30 involves increasing the angle α toward 90 degrees, such that more of the flow of air F is restrained by the baffle 30 in the vicinity of the server 22. "Closing" the baffle 30 involves decreasing the angle α towards 0 degrees, such that less of the flow of air F is restrained by the baffle 30 in the vicinity of the server 22. Referring to FIG. 2B, the angle α for the first and second baffles 30A,30B is the same at 60 degrees. In an alternate embodiment, one or more of the baffles 30 form different angles α relative to the holder 24.

Some possible shapes and sizes of the baffles 30 are now described with reference to FIGS. 2A and 2B. Each baffle 30 has a length L that is measured or defined between a root 30R of the baffle 30 that is adjacent to the holder 20, and a tip 30T of the baffle 30 that is located in the inner volume 12C of the room 21. The length L can vary or be selected to adjust the ability of the baffles 30 to locally restrain the flow of air F. In an embodiment, the length L of one or more of the baffles 30 is greater than 0 inches and less than 10 inches. In an embodiment, the length L of one or more of the baffles 30 is greater than 0 inches and less than 5 inches. In an embodiment, the length L of one or more of the baffles 30 is between 2.5 inches and 3.5 inches. Other values for the length L are possible, and may be determined based on the spacing or aisle width between adjacent rows of server holders 20, and/or on the angle α. The length L of the baffles 30 in one row of server holders 20 may be longer than the length L of the baffles 30 in another row of server holders 20, demonstrating that the length L of the baffles 30 may be selected for the specific airflow conditions in an aisle. The length L of adjacent baffles 30 in the same server holder 20 may vary. For example, and referring to FIGS. 2A and 2B, the first baffle 30A has a length L of 3.5 inches, and the second baffle 30B has a length of 2.5 inches such that the second baffle 30B is shorter than the first baffle 30A. These sizes for the first and second baffles 30A,30B may allow the lower, second baffle 30B to adequately restrain the flow of air F in front of the second lower server 22L2, while still allowing adequate cooling flow to reach the higher, first baffle 30A. Referring to FIGS. 2A and 2B, the baffles 30 are straight or planar bodies. In an alternate embodiment, one or more of the baffles 30 may be curved, or some or all of the baffle 30 may be curved or have a curvature greater than zero.

Figure 3A:
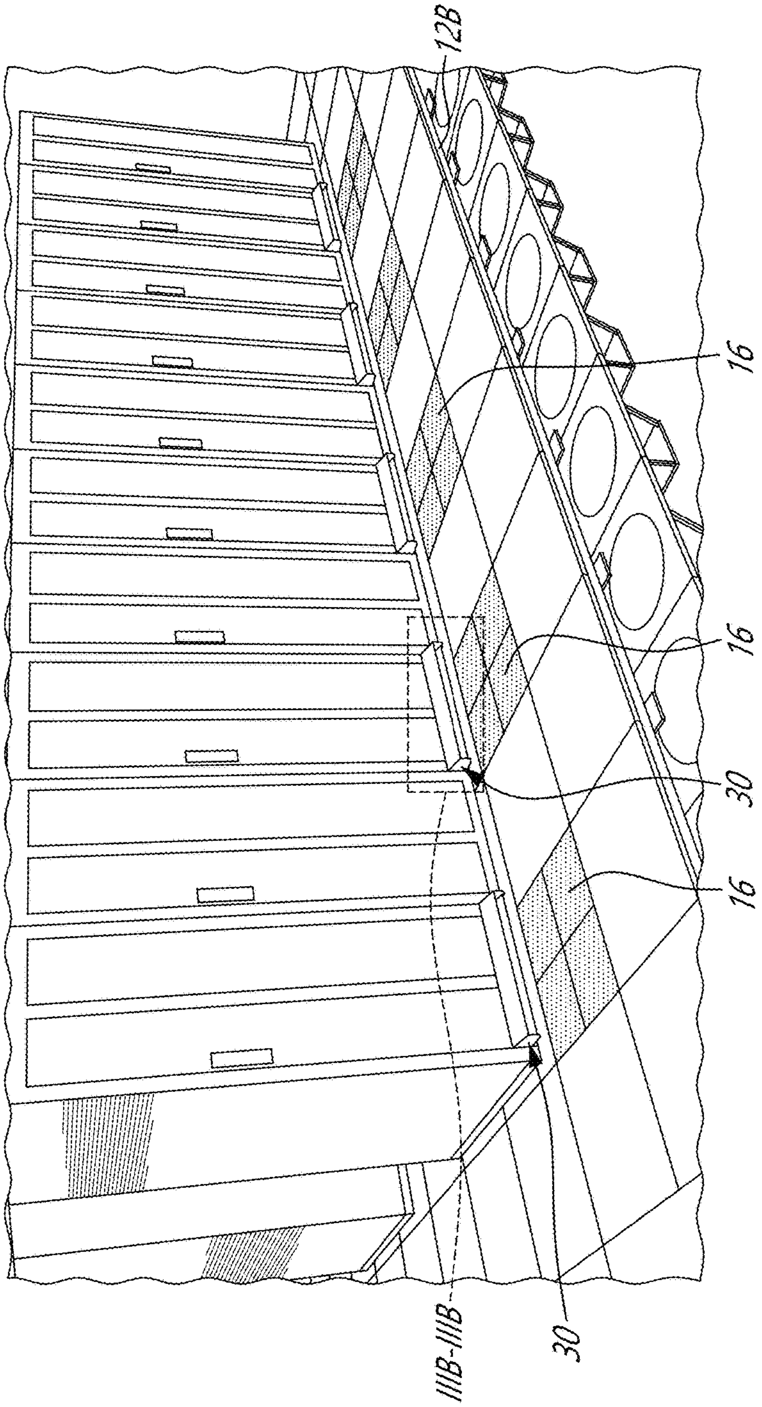
FIG. 3A is another perspective view of part of a room of a data center.
Figure 3B:
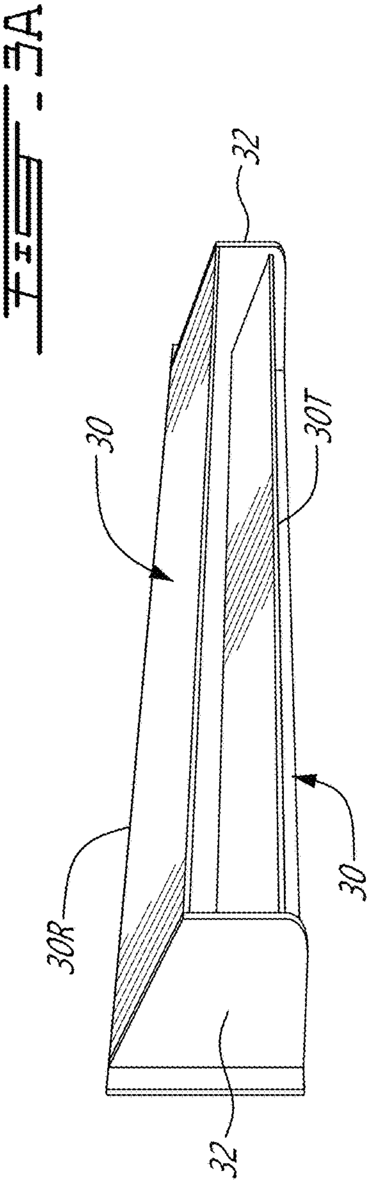
FIG. 3B is an enlarged perspective view of the portion IIIB-IIB in FIG. 3A.

The baffles 30 may have other shapes as well. For example, and referring to FIGS. 3A and 3B, the baffles 30 include side walls 32 that have an upright orientation. Each of the side walls 32 is located at one of the horizontal extremities of the baffles 30, and extends between and vertically past the baffles 30 to close off the horizontal ends of the baffles 30. The side walls 32 may function to guide some of the flow of air F from the floor panels 16 toward the baffles 30.

Figure 5:
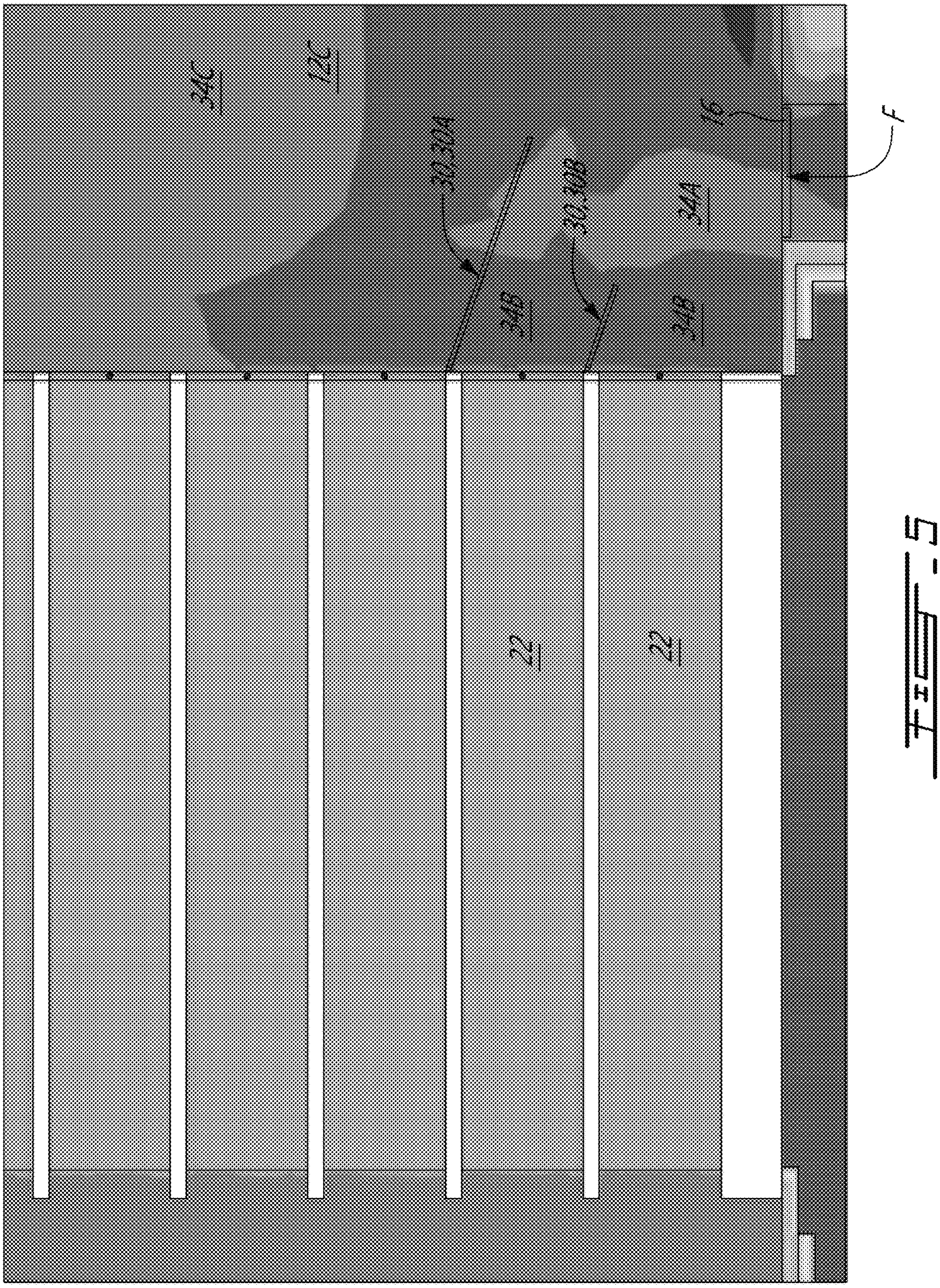
FIG. 5 is another pressure map showing pressure profiles for the part of the room of FIG. 1A.

The beneficial effect of the baffles 30 on the flow of air F may be better appreciated by considering the pressure profiles in FIG. 5. As the flow of air F enters the inner volume 12C of the room 12 from the floor panels 16, it is locally restrained by the first and second baffles 30A,30B. The static pressure of the air in the vicinity of the baffles 30 is increased, as shown in region 34A, and is even greater in region 34B which is immediately adjacent to the holder opening 24E and to the servers 22. By locally restraining the flow of air F in regions 34A,34B around the servers 22 in this manner, the baffles 30 allow the fans of these targeted servers 22 to more efficiently draw cooling air into the servers 22 to cool their internal components. The flow of air F further away from the baffles 30 in region 34C is unrestrained by the baffles 30, and thus has a lower static pressure than the air in regions 34A, 34B.

Figure 6:
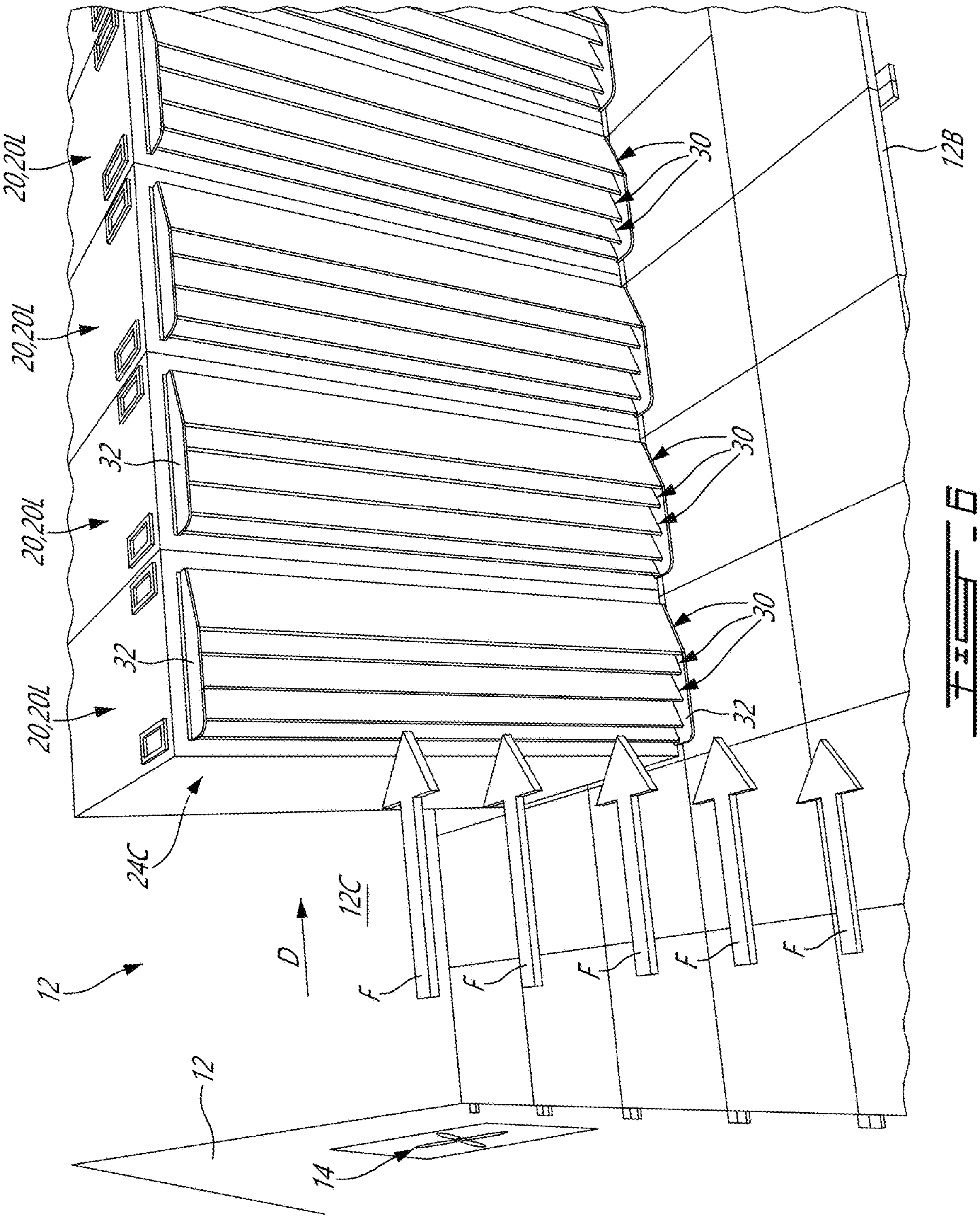
FIG. 6 is another perspective view of part of a room of a data center.

Yet another possible arrangement and orientation of the baffles 30 which achieve the functionalities described herein is now described. Referring to FIG. 6, the baffles 30 have a vertical configuration. The baffles 30 extend vertically across the holder opening 24E in a direction that is substantially perpendicular to the floor 12B. Each of the baffles 30 is a continuous or uninterrupted body. Each of the vertical baffles 30 extends over, and in front of, a majority of the servers 22 in the server holder 20. Referring to FIG. 6, each of the vertical baffles 30 extends over, and in front of, all of the servers 22 in the server holder 20. In an embodiment, the baffles 30 extend across only some of the holder opening 24E that is in fluid communication with the holder volume 24C. The baffles 30 have a vertical orientation in that they are oriented perpendicular to the floor 12B. Referring to FIG. 6, the number of baffles 30 mounted to the holder 24 is less than the number of servers 22 in the holder 24. Referring to FIG. 6, the number of baffles 30 is four per server holder 20, and they are mounted to the holder 24 to extend across all of the servers 22. Each of the vertical baffles 30 is spaced apart horizontally from an adjacent vertical baffle 30 on the same server holder 20.

In the configuration of the room 12 shown in FIG. 6, the fan 14 is adjacent to one of the walls 12A of the room 12, and provides cooling air by "flooding" the room 12 with the flow of air F. In such "flooded room" designs, a high velocity flow of air F enters a cold aisle along a horizontal direction between rows of server holders 20 from the perimeter of the room 12. The Venturi effect described above is also present in flooded room designs, and may affect a large number of servers 22 because most or all of the servers 22 in a single server holder 20 may be negatively impacted by the Venturi effect caused by the high velocity air coming from the fan 14 adjacent to one of the walls 12A of the room 12. In fact, in the "flooded room" approach, the problem presented by the high velocity air may be even greater than it is in the underfloor cooling room configuration because far more servers 22 may be negatively impacted by its effects in the flooded room approach.

Referring to FIG. 6, the server holders 20 have upright orientations, and the servers 22 are on vertically-spaced apart server supports 24B to form a vertical stack of servers 22. The server holders 20 include one or more leading server holders 20L. The leading server holders 20L are the first one or more server holders 20L in the row of server holders 20 when counting from the fan 14 in the direction of the flow of air F. The leading server holders 20L are the server holders 20 in the row of server holders 20 that are positioned closest to the fan 14, and thus closest to the wall 12A. The one or more leading server holders 20L include the server holder 20 that is closest to the fan 14 compared to the other server holders 20 in the row of server holders 20. In configurations where the velocity of the flow of air F is high, the servers 22 in the leading server holders 20L may not be adequately cooled, or their fans may have to work harder to draw sufficient cooling air into the servers 22. Referring to FIG. 6, there are four or more leading server holders 20L. Each of the leading server holders 20L has multiple vertical baffles 30 (four are shown, but fewer or more baffles 30 are possible) and horizontally-extending side walls 32.

In some embodiments, there may be only one leading server holder 20L with vertical baffles 30, or between two and six leading server holders 20L with vertical baffles 30, depending on the Venturi effect caused by the flow of air F from the fan 14. The number of leading server holders 20L in a row of server holders 20 may be less than the total number of server holders 20 in the same row of server holders 20. In this configuration of the server holders 20, and referring to FIG. 6, the vertical baffles 30 extend outwardly from the holders 24 and into the inner volume 12C of the room 12. The baffles 30 function to interfere with the flow of air F from the fan 14 so that the baffles 30 can slow the flow of air F and/or increase the static pressure of the air and/or guide the flow of air F in the vicinity of the servers 22 of the leading server holders 20L. The baffles 30 in FIG. 6 thus contribute to countering or reducing the impact of the Venturi effect described above on the servers 22 of the leading server holders 20L, which are the servers 22 in the row of server holders 22 which may be most negatively impacted by the Venturi effect.

Referring to FIG. 6, the baffles 30 extend outwardly from the holder 24 at an angle α that is defined with respect to part of the holder 24, for example the door 24D of the holder 24. The angle α may also be defined with respect to the direction D of the flow of air F from the fan 14, this direction D being substantially parallel to the floor 12B. The baffles 30 are inclined toward the fan 14, and thus into the direction of the flow of air F, such that the angle α is greater than 0 degrees and less than 90 degrees. In an embodiment, the angle α is greater than 45 degrees and less than 90 degrees. In an embodiment, the angle α is about 60 degrees. In an embodiment, the angle α is greater than 0 degrees and less than 45 degrees. The angle α may be adjusted to "open" or "close" each baffle 30 with respect to the oncoming flow of air F. "Opening" the baffle 30 involves increasing the angle α toward 90 degrees, such that more of the flow of air F is restrained by the baffle 30 in the vicinity of the servers 22. "Closing" the baffle 30 involves decreasing the angle α towards 0 degrees, such that less of the flow of air F is restrained by the baffle 30 in the vicinity of the servers 22. Referring to 6, the angle α for each baffle 30 on a given one of the leading server holders 20L is the same. In an alternate embodiment, one or more of the baffles 30 on a given one of the leading server holders 20L form different angles α.

Figure 7B:
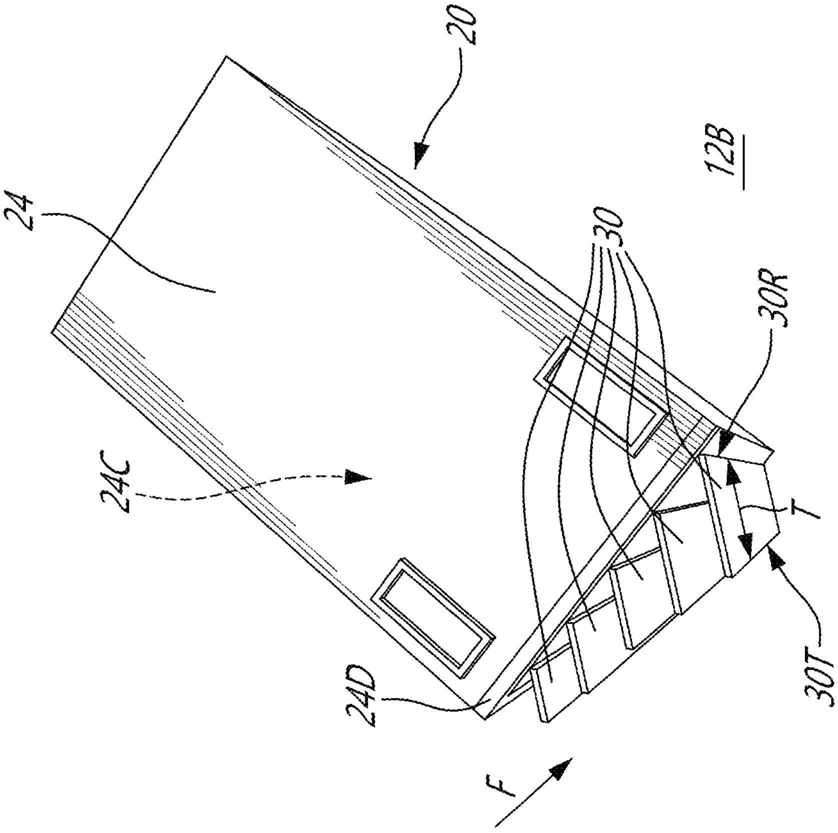
FIG. 7B is a top view of the server holder of FIG. 7A.
Figure 7A:
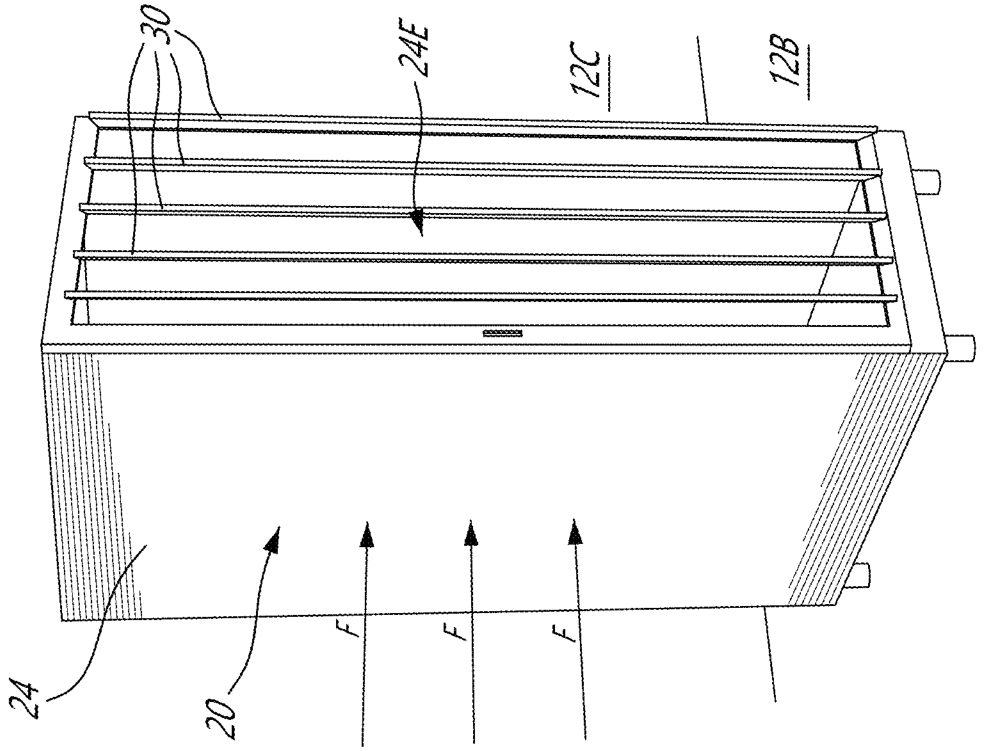
FIG. 7A is a perspective view of a server holder of a data center.

Yet another possible arrangement and orientation of the baffles 30 which achieve the functionalities described herein is now described. Referring to FIGS. 7A and 7B, the baffles 30 have a vertical configuration. The description of the baffles 30 provided above with respect to FIG. 6 applies mutatis mutandis to the baffles 30 shown in FIGS. 7A and 7B. The baffles 30 extend vertically across the holder opening 24E in a direction that is substantially perpendicular to the floor 12B. Each of the baffles 30 is a continuous or uninterrupted body. Each of the vertical baffles 30 extends over, and in front of, a majority of the servers 22 in the server holder 20. Referring to FIGS. 7A to 7B, each of the vertical baffles 30 extends over, and in front of, all of the servers 22 in the server holder 20. In an embodiment, the baffles 30 extend across only some of the holder opening 24E that is in fluid communication with the holder volume 24C. The baffles 30 have a vertical orientation in that they are oriented perpendicular to the floor 12B. Referring to FIGS. 7A and 7B, the number of baffles 30 mounted to the holder 24 is less than the number of servers 22 in the holder 24. Referring to FIGS. 7A to 7B, the number of baffles 30 is four per server holder 20, and they are mounted to the holder 24 to extend across all of the servers 22. Each of the vertical baffles 30 is spaced apart horizontally from an adjacent vertical baffle 30 on the same server holder 20.

Referring to FIGS. 7A to 7B, the vertical baffles 30 extend outwardly from the holders 24 and into the inner volume 12C of the room 12. The baffles 30 function to interfere with the flow of air F from the fan 14 so that the baffles 30 can slow the flow of air F and/or increase the static pressure of the air and/or guide the flow of air F in the vicinity of the servers 22 of the leading server holders 20L. The baffles 30 in FIGS. 7A to 7B thus contribute to countering or reducing the impact of the Venturi effect on the servers 22 of the server holders 20L which are closest to the fan 14, and which are the servers 22 in the row of server holders 22 which may be most negatively impacted by the Venturi effect.

Referring to FIGS. 7A to 7B, the baffles 30 extend outwardly from the holder 24 at an angle α that is defined with respect to part of the holder 24, for example the door 24D of the holder 24. The angle α may also be defined with respect to the direction D of the flow of air F from the fan 14, this direction D being substantially parallel to the floor 12B. The baffles 30 are inclined toward the fan 14, and thus into the direction of the flow of air F, such that the angle α is greater than 0 degrees and less than 90 degrees. In an embodiment, the angle α is greater than 45 degrees and less than 90 degrees. In an embodiment, the angle α is about 60 degrees. In an embodiment, the angle α is greater than 0 degrees and less than 45 degrees. The angle α may be adjusted to "open" or "close" each baffle 30 with respect to the oncoming flow of air F. "Opening" the baffle 30 involves increasing the angle α toward 90 degrees, such that more of the flow of air F is restrained by the baffle 30 in the vicinity of the servers 22. "Closing" the baffle 30 involves decreasing the angle α towards 0 degrees, such that less of the flow of air F is restrained by the baffle 30 in the vicinity of the servers 22. Referring to 6, the angle α for each baffle 30 on a given one of the leading server holders 20L is the same. In an alternate embodiment, one or more of the baffles 30 on a given one of the server holders 20 closest to the fan 14 form different angles α.

Referring to FIG. 7B, each baffle 30 has a length L that is measured or defined between a root 30R of the baffle 30 that is adjacent to the holder 20, and a tip 30T of the baffle 30 that is located in the inner volume 12C of the room 21. The length L can vary or be selected to adjust the ability of the baffles 30 to locally restrain the flow of air F. For example, and referring to FIG. 7B, all of the vertical baffles 30 of the server holder 20 have different lengths L. Referring to FIG. 7B, the length L of the baffle 30 that is closest to the fan 14 and to the oncoming flow of air F is less than the length L of the baffle 30 that is furthest from the fan 14. Referring to FIG. 7B, the length L of the baffle 30 that is furthest from the fan 14 is greater than the lengths L of all the other baffles 30 of the server holder 20. Referring to FIG. 7B, the length L of the baffle 30 that is closest to the fan 14 is less than the lengths L of all the other baffles 30 of the server holder 20. Referring to FIG. 7B, the length L of the baffles 30 increases with each baffle 30, in the direction starting from the baffle 30 closest to the fan 14 (which is the shortest length L) to the baffle 30 furthest from the fan 14 (which has the greatest length L). In an embodiment, the length L of one or more of the baffles 30 is greater than 0 inches and less than 10 inches.

Referring to FIGS. 2B and 6, there is disclosed a method of restraining the flow of air F around part of the server cabinet/rack (i.e. the server holder 20). This method may also be referred to as a method of slowing or restraining the flow of air F in the data center 10. The method includes mounting one or more baffles 30 to an exterior of the server holder 20 adjacent to one or more of the server supports 24B (and the one or more servers 22 supported thereby), such that the at least one baffle 30 extends outwardly from the server holder 20 to restrain the flow of air F outside the server holder 20 around the one or more server supports 24B.

Referring to FIGS. 2B and 6, there is disclosed a method of increasing the capacity of the server holder 20. The "capacity" may refer to the power consumption of the server holder 20, in Watts for example. The method includes mounting one or more baffles 30 to an exterior of the server holder 20 adjacent to one or more of the server supports 24B (and the one or more servers 22 supported thereby), such that the at least one baffle 30 extends outwardly from the server holder 20 to restrain the flow of air F outside the server holder 20 around the one or more server supports 24B. By helping to improve the efficiency at which the fans of the servers 22 draw cooling air into the servers 22, the baffles 30 may allow for higher capacity server holders 20 which may have higher heat loads to be used (e.g. use 18 kW server holders 20 instead of 9 kW ones, or use 30 kW server holders 20 instead of 18 kW ones), thereby helping to increase the capacity of the server holder 20. The method also includes "opening" or "closing" the baffles 30, as described above, to increase or decrease the capacity of the server holder 20.

The embodiments described in this document provide non-limiting examples of possible implementations of the present technology. Upon review of the present disclosure, a person of ordinary skill in the art will recognize that changes may be made to the embodiments described herein without departing from the scope of the present technology. For example, although the expressions "server" and "server holder" are used herein, the baffles 30 are not limited to being used only with these devices, and may also be used with other types of cabinets, racks, etc. which house or support other electrical or electro-mechanical equipment or objects. Similarly, the baffles 30 are not limited to being used only in data centers 10, and may also be used with any other type of electro-mechanical distribution system. Yet further modifications could be implemented by a person of ordinary skill in the art in view of the present disclosure, which modifications would be within the scope of the present technology.

The invention claimed is:

1. A data center, comprising:

a room defining a volume of the room, the room including a floor defining an underfloor having a lower level and an upper level, the lower level including a plenum, the upper level including conduits fluidly connecting the plenum to the floor;

at least one fan operable to convey air through the underfloor via the plenum and conduits and into the volume of the room;

server holders in the room, at least one of the server holders including:

a holder defining a holder volume and having server supports spaced apart in the holder volume, the holder defining a holder opening to permit fluid communication between the holder volume and the air in the volume of the room;

a plurality of servers supported by the server supports to be in fluid communication with the air in the volume of the room via the holder opening, the plurality of servers forming a vertical stack of servers; and at least one baffle mounted to the holder adjacent to one or more servers of the plurality of servers, the at least one baffle extending outwardly from the holder into the volume of the room, the at least one baffle shaped and sized to locally restrain the air being conveyed through the volume of the room around the one or more servers.

2. The data center of claim 1, wherein the at least one baffle extends outwardly from the holder at an angle defined with respect to the holder, the angle being greater than 0 degrees and less than 90 degrees.

3. The data center of claim 2, wherein the angle is greater than 45 degrees and less than 90 degrees.

4. The data center of claim 1, wherein the at least one baffle has a horizontal orientation or a vertical orientation.

5. The data center of claim 1, wherein the at least one baffle has a horizontal orientation, and the at least one baffle is adjacent to a number of servers less than all of the servers.

6. The data center of claim 1, wherein the at least one baffle has a vertical orientation, and the at least one baffle is adjacent to all of the servers.

7. The data center of claim 1, wherein the room includes at least one floor panel positioned on the floor in front of the holder of the at least one of the server holders, the at least one fan operable to convey the air through the underfloor and into the room via the at least one floor panel:

the holder being upright and the servers supported by the server supports being vertically spaced apart, the servers including one or more lower servers positioned closer to the at least one floor panel than a remainder of the servers; and the at least one baffle having a horizontal orientation and mounted to the holder adjacent to one or more of the one or more lower servers.

8. The data center of claim 7, wherein the at least one baffle includes a plurality of baffles, the plurality of baffles including a first baffle mounted to the holder in front of a first server of the one or more of lower servers, and a second baffle mounted to the holder in front of a second server of the one or more of lower servers, the first baffle being above the second baffle.

9. The data center of claim 1, wherein the at least one fan is operable to convey the air through the room from a wall of the room, the server holders arranged in a row of server holders, one or more leading server holders of the row of server holders positioned closer to the wall than a remainder of the server holders of the row of server holders, one or more of the one or more leading server holders including:

the holder being upright and the servers supported by the server supports being vertically spaced apart.

10. The data center of claim 1, wherein the holder opening extends vertically along the entirety of a stack height of the holder.

11. A server holder positionable in a room, comprising:

a holder defining a holder volume and having server supports spaced apart in the holder volume to support servers, the holder defining a holder opening to permit fluid communication between the server supports in the holder volume and air flowing through a volume of the room outside the holder, the server supports arranged vertically along a height of the holder defined between a bottom of the holder and a top of the holder; and at least two baffles mounted to the holder adjacent to one or more of the server supports, the at least two baffles extending outwardly from the holder, the at least two baffles shaped and sized to locally restrain the air flowing through the volume of the room outside the holder around the one or more server supports, each of the at least two baffles vertically positioned in a lower half of the holder, wherein each of the at least two baffles has a length defined between a baffle root and a baffle tip, the length of a first of the at least two baffles being greater than the length of a second of the at least two baffles.

12. The server holder of claim 11, wherein each of the at least two baffles extends outwardly from the holder at an angle defined with respect to the holder, the angle being greater than 1 degree and less than 90 degrees.

13. The server holder of claim 11, wherein the length of each of the at least two baffles is less than 10 inches.

14. The server holder of claim 11, wherein each of the at least two baffles has a horizontal orientation or a vertical orientation.

15. The server holder of claim 11, wherein the holder is upright and the server supports are vertically spaced apart, the server supports including one or more lower server supports positioned closer to a bottom of the holder than a remainder of the server supports, each of the at least two baffles having a horizontal orientation and mounted to the holder adjacent to one or more of the one or more lower server supports.

16. The server holder of claim 11, wherein the holder opening extends vertically along an entirety of a height of the holder.

17. A method of restraining a flow of air through a volume of a room around part of a server cabinet/rack, the room including a floor defining an underfloor having a lower level and an upper level, the lower level including a plenum, the upper level including conduits fluidly connecting the plenum to the floor, the flow of air conveyed to the volume of the room through the underfloor via the plenum and the conduits, the method comprising: mounting at least one baffle to an exterior of the server cabinet/rack adjacent to one or more server supports of the server cabinet/rack, such that the at least one baffle extends outwardly from the server cabinet/rack to restrain the flow of air outside the server cabinet/rack in the volume of the room around the one or more server supports.

18. The method of claim 17, wherein mounting the at least one baffle includes mounting the at least one baffle at an angle defined with respect to the exterior of the server cabinet/rack, the angle being greater than 0 degrees and less than 90 degrees.

19. The method of claim 17, wherein mounting the at least one baffle includes mounting the at least one baffle to have a horizontal orientation or a vertical orientation.

20. The method of claim 17, wherein mounting the at least one baffle includes mounting the at least one baffle to have a horizontal orientation, and mounting the at least one baffle adjacent to a number of server supports less than all of the server supports.

* * * * *